(12) United States Patent
Kang et al.

(10) Patent No.: US 10,665,429 B2
(45) Date of Patent: *May 26, 2020

(54) SYSTEMS AND METHODS FOR SUPPRESSING PARASITIC PLASMA AND REDUCING WITHIN-WAFER NON-UNIFORMITY

(71) Applicant: LAM RESEARCH CORPORATION, Fremont, CA (US)

(72) Inventors: Hu Kang, Tualatin, OR (US); Adrien LaVoie, Newberg, OR (US); Shankar Swaminathan, Beaverton, OR (US); Jun Qian, Sherwood, OR (US); Chloe Baldasseroni, Portland, OR (US); Frank Pasquale, Tualatin, OR (US); Andrew Duvall, Portland, OR (US); Ted Minshall, Sherwood, OR (US); Jennifer Petraglia, Portland, OR (US); Karl Leeser, West Linn, OR (US); David Smith, Lake Oswego, OR (US); Sesha Varadarajan, Lake Oswego, OR (US); Edward Augustyniak, Tualatin, OR (US); Douglas Keil, West Linn, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 247 days.

This patent is subject to a terminal disclaimer.

(21) Appl. No.: 15/703,213

(22) Filed: Sep. 13, 2017

(65) Prior Publication Data
US 2018/0068833 A1 Mar. 8, 2018

Related U.S. Application Data

(62) Division of application No. 14/668,174, filed on Mar. 25, 2015, now Pat. No. 9,793,096.

(Continued)

(51) Int. Cl.
C23C 16/50 (2006.01)
H01J 37/32 (2006.01)
(Continued)

(52) U.S. Cl.
CPC ........ H01J 37/3244 (2013.01); C23C 16/345 (2013.01); C23C 16/402 (2013.01);
(Continued)

(58) Field of Classification Search
CPC ............ H01J 37/3244; H01J 37/32568; H01J 37/32623; C23C 16/505; C23C 16/402;
(Continued)

(56) References Cited

U.S. PATENT DOCUMENTS 4,825,809 A * 5/1989 Mieno ............... C23C 16/45504
118/725
5,233,163 A * 8/1993 Mieno ............... H01L 21/67103
118/725
(Continued)

FOREIGN PATENT DOCUMENTS

CN 1513197 A 7/2004
CN 101031180 A 9/2007
(Continued)

OTHER PUBLICATIONS

First Office Action regarding Chinese Patent Application No. 201510573406.3 dated Jan. 22, 2017. No Translation provided.

*Primary Examiner* — Rudy Zervigon

(57) ABSTRACT

A substrate processing system for depositing film on a substrate includes a processing chamber defining a reaction volume. A showerhead includes a stem portion having one end connected adjacent to an upper surface of the processing chamber. A base portion is connected to an opposite end of the stem portion and extends radially outwardly from the stem portion. The showerhead is configured to introduce at (Continued)

least one of process gas and purge gas into the reaction volume. A plasma generator is configured to selectively generate RF plasma in the reaction volume. An edge tuning system includes a collar and a parasitic plasma reducing element that is located around the stem portion between the collar and an upper surface of the showerhead. The parasitic plasma reducing element is configured to reduce parasitic plasma between the showerhead and the upper surface of the processing chamber.

20 Claims, 8 Drawing Sheets

Related U.S. Application Data

(60) Provisional application No. 62/049,767, filed on Sep. 12, 2014.

(51) Int. Cl.
 C23C 16/505 (2006.01)
 C23C 16/455 (2006.01)
 C23C 16/40 (2006.01)
 C23C 16/34 (2006.01)
 C23C 16/509 (2006.01)

(52) U.S. Cl.
 CPC ...... C23C 16/405 (2013.01); C23C 16/45565 (2013.01); C23C 16/505 (2013.01); C23C 16/509 (2013.01); H01J 37/32568 (2013.01); H01J 37/32623 (2013.01)

(58) Field of Classification Search
 CPC ............ C23C 16/345; C23C 16/45565; C23C 16/405
 USPC ........................................ 118/715; 156/345.1
 See application file for complete search history.

(56) References Cited

U.S. PATENT DOCUMENTS

| | | | | |
|---|---|---|---|---|
| 5,453,124 A * | 9/1995 | Moslehi | ............ | C23C 16/45561 118/715 |
| 5,532,190 A * | 7/1996 | Goodyear | ......... | C23C 16/45512 118/715 |
| 5,741,363 A * | 4/1998 | Van Buskirk | ......... | C23C 16/455 118/715 |
| 6,010,748 A * | 1/2000 | Van Buskirk | ......... | C23C 16/455 427/248.1 |
| 6,474,258 B2 | 11/2002 | Brcka | | |
| 7,004,107 B1 | 2/2006 | Raoux et al. | | |
| 7,147,718 B2 * | 12/2006 | Jurgensen | ............ | C23C 16/455 118/715 |
| 8,945,306 B2 * | 2/2015 | Tsuda | .................... | C23C 16/409 118/715 |
| 9,388,494 B2 * | 7/2016 | Xia | .................... | C23C 16/45502 |
| 9,399,228 B2 * | 7/2016 | Breiling | ............ | C23C 16/45565 |
| 9,449,795 B2 * | 9/2016 | Sabri | .................... | C23C 16/505 |
| 9,508,547 B1 * | 11/2016 | Pasquale | ............ | C23C 16/45502 |
| 9,617,638 B2 * | 4/2017 | LaVoie | ............. | C23C 16/45519 |
| 9,758,868 B1 * | 9/2017 | Breiling | ............. | C23C 16/4408 |
| 9,793,096 B2 * | 10/2017 | Kang | .................... | C23C 16/505 |
| 2003/0042227 A1 * | 3/2003 | Fink | .................. | H01J 37/32871 216/63 |
| 2003/0054099 A1 * | 3/2003 | Jurgensen | ............ | C23C 14/0015 427/248.1 |
| 2004/0168769 A1 * | 9/2004 | Matsuoka | ............ | C23C 16/4404 156/345.33 |
| 2004/0200412 A1 * | 10/2004 | Frijlink | ................ | C23C 16/4412 118/715 |
| 2007/0187363 A1 * | 8/2007 | Oka | .................... | H01J 37/3244 216/59 |
| 2008/0233757 A1 * | 9/2008 | Honda | .............. | H01J 37/32091 438/711 |
| 2009/0095220 A1 * | 4/2009 | Meinhold | ......... | C23C 16/45565 118/712 |
| 2009/0159424 A1 * | 6/2009 | Liu | .................... | H01J 37/3244 204/164 |
| 2012/0024449 A1 | 2/2012 | Ricci et al. | | |
| 2013/0092086 A1 * | 4/2013 | Keil | .................... | H01J 37/3255 118/723 E |
| 2013/0213572 A1 * | 8/2013 | Honda | .............. | H01J 37/32091 156/345.24 |
| 2013/0344245 A1 * | 12/2013 | Xia | .................... | H01J 37/3244 118/715 |
| 2014/0217193 A1 * | 8/2014 | Breiling | .................. | B05B 1/005 239/1 |
| 2014/0238608 A1 * | 8/2014 | Sabri | .................... | C23C 16/505 156/345.34 |
| 2015/0167168 A1 * | 6/2015 | Keshavamurthy | ........................... | C23C 16/45565 438/758 |
| 2016/0035566 A1 * | 2/2016 | LaVoie | .............. | C23C 16/45519 438/778 |
| 2016/0079036 A1 * | 3/2016 | Kang | .................. | H01J 37/3244 156/345.34 |
| 2016/0289832 A1 * | 10/2016 | Xia | .................... | C23C 16/45502 |
| 2017/0167017 A1 * | 6/2017 | LaVoie | ............. | H01L 21/02334 |
| 2018/0012733 A1 * | 1/2018 | Phillips | ............. | H01J 37/32091 |

FOREIGN PATENT DOCUMENTS

| | | |
|---|---|---|
| CN | 101999158 A | 3/2011 |
| CN | 103026799 A | 4/2013 |
| CN | 103999193 A | 8/2014 |
| JP | 2001525618 A | 12/2001 |

* cited by examiner

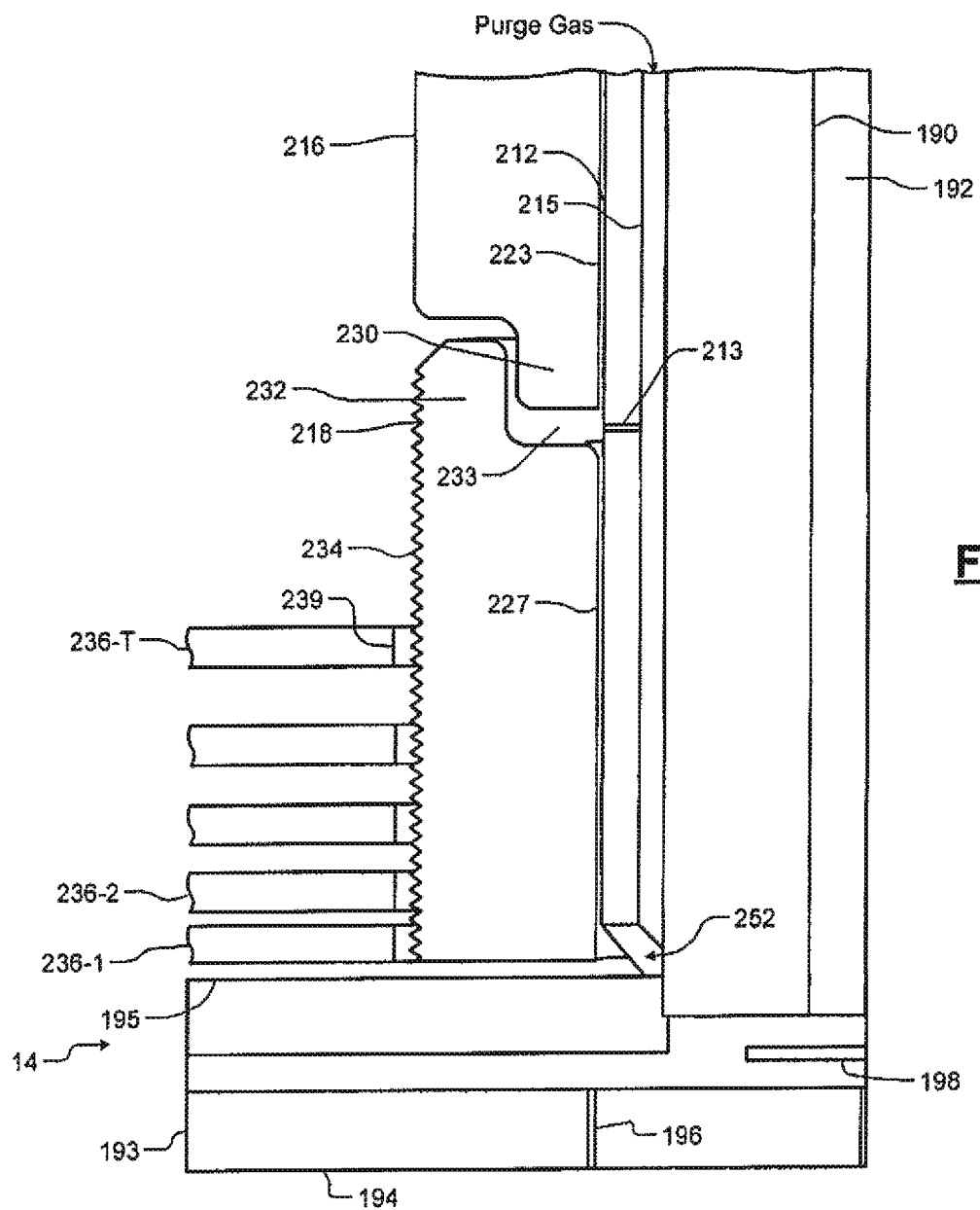
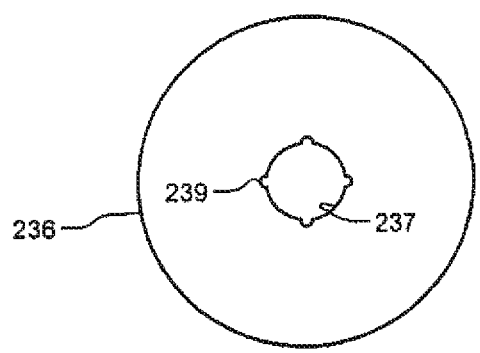
FIG. 3A
FIG. 3B

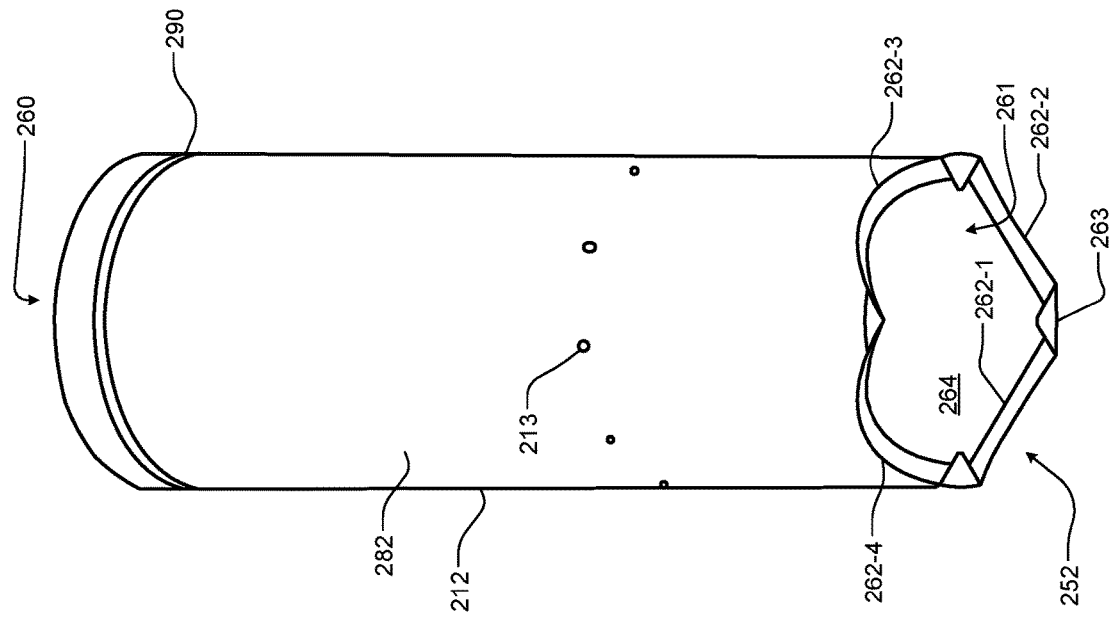
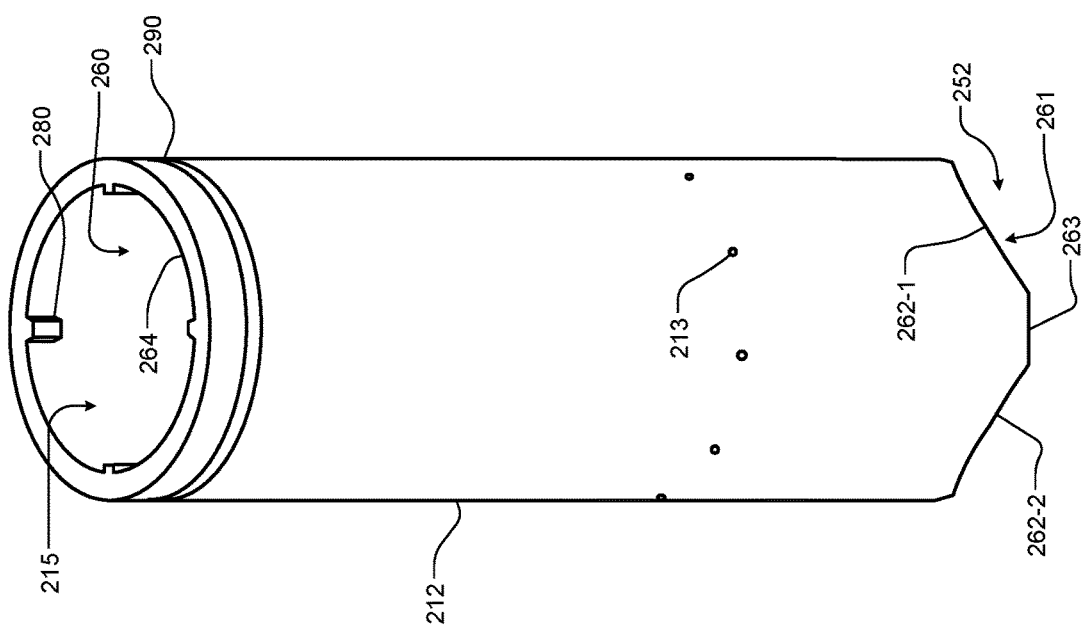

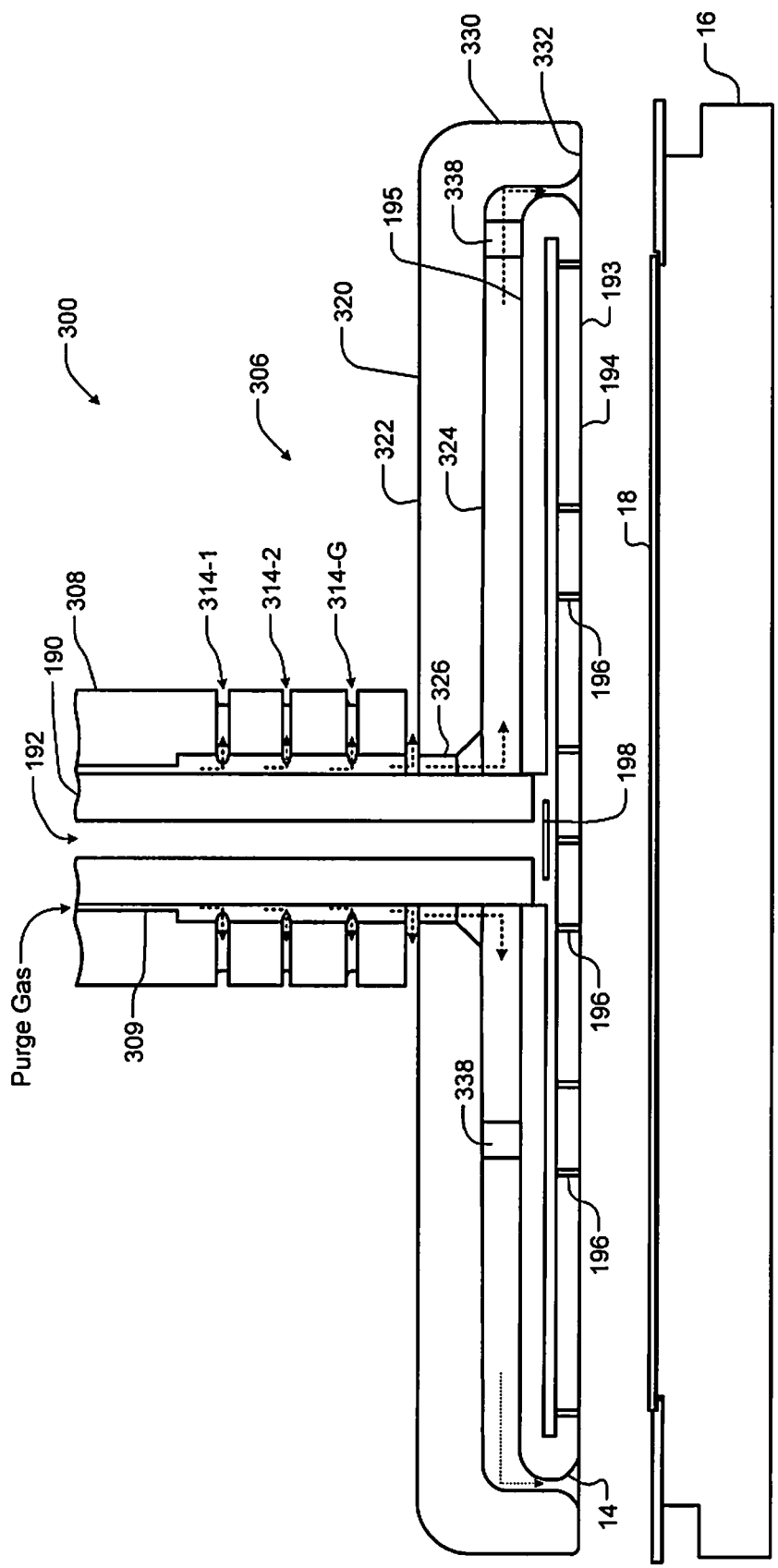

SYSTEMS AND METHODS FOR SUPPRESSING PARASITIC PLASMA AND REDUCING WITHIN-WAFER NON-UNIFORMITY

CROSS-REFERENCE TO RELATED APPLICATIONS

This application is a divisional of U.S. application Ser. No. 14/668,174 filed on Mar. 25, 2015 which claims the benefit of U.S. Provisional Application No. 62/049,767, filed on Sep. 12, 2014. The entire disclosures of the applications referenced above are incorporated herein by reference.

FIELD

The present disclosure relates to substrate processing systems, and more particularly to systems and methods for suppressing parasitic plasma and reducing within-wafer non-uniformity.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform deposition of film on a substrate. Substrate processing systems typically include a processing chamber with a reaction volume. A substrate support such as a pedestal, a chuck, a plate, etc. is arranged in the processing chamber. A substrate such as a semiconductor wafer may be arranged on the substrate support.

In some applications, the film is deposited using plasma-enhanced chemical vapor deposition (PECVD) or plasma-enhanced atomic layer deposition (PEALD). During PEALD, one or more PEALD cycles are performed to deposit film on the substrate. Each PEALD cycle typically includes precursor dose, dose purge, RF plasma dose, and RF purge steps.

During deposition, process gas may be delivered to the processing chamber using a showerhead. During RF plasma dosing, RF power is supplied to the showerhead and the substrate support is grounded (or vice versa). During PEALD, plasma-enhanced conversion of the precursor occurs on the substrate.

During the dose purge and RF purge steps, inert gas such as argon is supplied through the showerhead. In addition, a secondary purge may be performed above the showerhead during some or all of the PEALD steps to prevent undesirable deposition in remote areas such as a backside of the showerhead, a top plate of the processing chamber and/or walls of the processing chamber.

When argon is used as the secondary purge gas for some nitrogen-free applications such as double-patterning, parasitic plasma may occur behind the showerhead. The power that is consumed by the parasitic plasma can be as much as 40% of the total plasma power delivered to the processing chamber. On-substrate delivered power loss usually results in looser film with elevated etch rate. The parasitic plasma induced power loss is usually non-uniform across the showerhead. More particularly, higher power loss occurs at an edge portion of the showerhead as compared to center portions of showerhead due to the RF power supplied at a stem portion of the showerhead.

The film deposited at the center of the substrate is denser than that at the edge of the substrate. As a result, the film has an edge-thick profile and high within-substrate non-uniformity, which is unfavorable for critical dimension (CD) uniformity control in double-patterning applications. In addition, operating the substrate processing system with high parasitic plasma tends to cause long term issues with wafer-to-wafer repeatability, tool drift, process defect performance, and erosion of showerhead components.

SUMMARY

A substrate processing system for depositing film on a substrate includes a processing chamber defining a reaction volume. A showerhead includes a stem portion having one end connected adjacent to an upper surface of the processing chamber. A base portion is connected to an opposite end of the stem portion and extends radially outwardly from the stem portion. The showerhead is configured to introduce at least one of process gas and purge gas into the reaction volume. A plasma generator is configured to selectively generate RF plasma in the reaction volume. An edge tuning system includes a collar arranged around the stem portion of the showerhead between the base portion of the showerhead and the upper surface of the processing chamber. The collar includes one or more holes for supplying purge gas from an inner cavity of the collar to an area between the base portion of the showerhead and the upper surface of the processing chamber. The purge gas is a reactant gas. A parasitic plasma reducing element is located around the stem portion between the collar and an upper surface of the showerhead and is configured to reduce parasitic plasma between the showerhead and the upper surface of the processing chamber.

In other features, the collar has a generally "T"-shaped cross-section. The one or more holes are arranged perpendicular to the stem portion of the showerhead. The collar includes one or more projections to provide uniform spacing between the inner cavity of the collar and an outer surface of the stem portion. The parasitic plasma reducing element includes a showerhead cover made of a ceramic material. The showerhead cover has a generally "C"-shaped cross section that covers the upper surface of the showerhead and sides of the showerhead. The showerhead cover has a thickness between ⅜" and 1". A spacer is arranged between the showerhead cover and an upper surface of the showerhead. The spacer has a thickness between ¼" and ½".

In other features, the showerhead cover includes a first portion with a generally "C"-shaped cross section that covers the upper surface of the showerhead and sides of the showerhead and second portions that extend radially outwardly from opposite ends of the first portions in a plane parallel to the substrate. The showerhead cover has a thickness between 1/16" and ¼". A spacer is arranged between the showerhead cover and an upper surface of the showerhead. The spacer has a thickness between ¼" and ¾". The parasitic plasma reducing element includes a plurality of plates that are arranged in a spaced relationship between the upper surface of the showerhead and the collar.

In other features, the parasitic plasma reducing element further includes spacers arranged between adjacent ones of the plurality of plates. Each of the plurality of plates includes a central opening that is larger than an outer diameter of the stem portion to allow purge gas to flow from the collar through the central opening of the plates and between the plates. An insert arranged between the plurality of plates and the stem portion. The insert is made of polyimide.

In other features, the insert includes a stem portion and an annular base portion. The stem portion is arranged adjacent to and in contact with the stem portion of the showerhead. The annular base portion extends outwardly from a showerhead-side portion of the insert.

In other features, the collar includes an inner collar arranged adjacent to the stem portion, an upper outer collar arranged around an upper portion of the inner collar, and a lower outer collar arranged around a lower portion of the inner collar. The parasitic plasma reducing element includes a plurality of plates that are arranged in a spaced relationship between the upper surface of the showerhead and the collar. The plurality of plates includes a central opening that is threaded. The lower outer collar includes a threaded radially outer surface and wherein the plurality of plates is threaded onto the lower outer collar.

In other features, the inner collar includes a plurality of holes that are aligned with a space between the upper outer collar and the lower outer collar, and wherein purge gas flows through the plurality of holes of the inner collar. The plurality of plates includes cutouts along the central opening to allow purge gas flow between the plurality of plates.

In other features, the inner collar includes openings along a showerhead-side end thereof to allow purge gas to flow between the plates and the showerhead.

In other features, the reactant gas is selected from a group including molecular oxygen, molecular hydrogen, molecular nitrogen, nitrous oxide, and ammonia. The reactant gas includes molecular oxygen and the film includes silicon dioxide. The reactant gas includes nitrous oxide and the film includes silicon dioxide. The reactant gas includes molecular oxygen and the film includes titanium dioxide. The reactant gas includes nitrous oxide and the film includes titanium dioxide. The reactant gas includes molecular nitrogen and the film includes silicon nitride. The reactant gas includes ammonia and the film includes silicon nitride.

A substrate processing system for depositing film on a substrate includes a processing chamber defining a reaction volume. A showerhead includes a stem portion having one end connected adjacent to an upper surface of the processing chamber. A base portion is connected to an opposite end of the stem portion and extends radially outwardly from the stem portion. The showerhead is configured to introduce at least one of process gas and purge gas into the reaction volume. A plasma generator is configured to selectively generate RF plasma in the reaction volume. An edge tuning system includes a collar arranged around the stem portion of the showerhead between the base portion of the showerhead and the upper surface of the processing chamber. The collar includes one or more holes for supplying purge gas from an inner cavity of the collar to an area between the base portion of the showerhead and the upper surface of the processing chamber. A parasitic plasma reducing element is located around the stem portion between the collar and an upper surface of the showerhead and is configured to reduce parasitic plasma between the showerhead and the upper surface of the processing chamber. The parasitic plasma reducing element includes a plurality of plates that are arranged in a spaced relationship between the upper surface of the showerhead and the collar.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3A is an enlarged cross-sectional view of the first edge tuning system;

FIG. 3B is a plan view of an example of a plate;

FIGS. 4A and 4B are perspective views of an example of an inner collar;

FIG. 5 is a cross-sectional view of an example of a second edge tuning system according to the present disclosure;

In the drawings, reference numbers may be reused to identify similar and/or identical elements.

DETAILED DESCRIPTION

This present disclosure relates to substrate processing systems for PECVD and PEALD with edge tuning systems to suppress parasitic plasma behind a showerhead and to reduce within-substrate non-uniformity. For example in a typical PEALD process, purge gas flowing to a backside of the showerhead is used to reduce undesirable deposition of film at the backside of the showerhead and other remote areas in the processing chamber. When argon is used for some applications such as double-patterning, the parasitic plasma ignites on a top surface of the showerhead, which causes high within-wafer non-uniformity and a thick edge profile due to the parasitic-induced on-substrate delivered power loss. The systems and methods described herein employ an edge tuning system arranged on the top surface of the showerhead to suppress the parasitic plasma and reduce within-substrate non-uniformity.

In some examples, the edge tuning system includes a combination of collar arranged around the stem portion and a parasitic plasma reducing element arranged between the collar and an upper surface of the showerhead. In some examples, the parasitic plasma reducing element includes a showerhead cover. In some examples, the parasitic plasma reducing element includes parallel plates.

Figure 1:
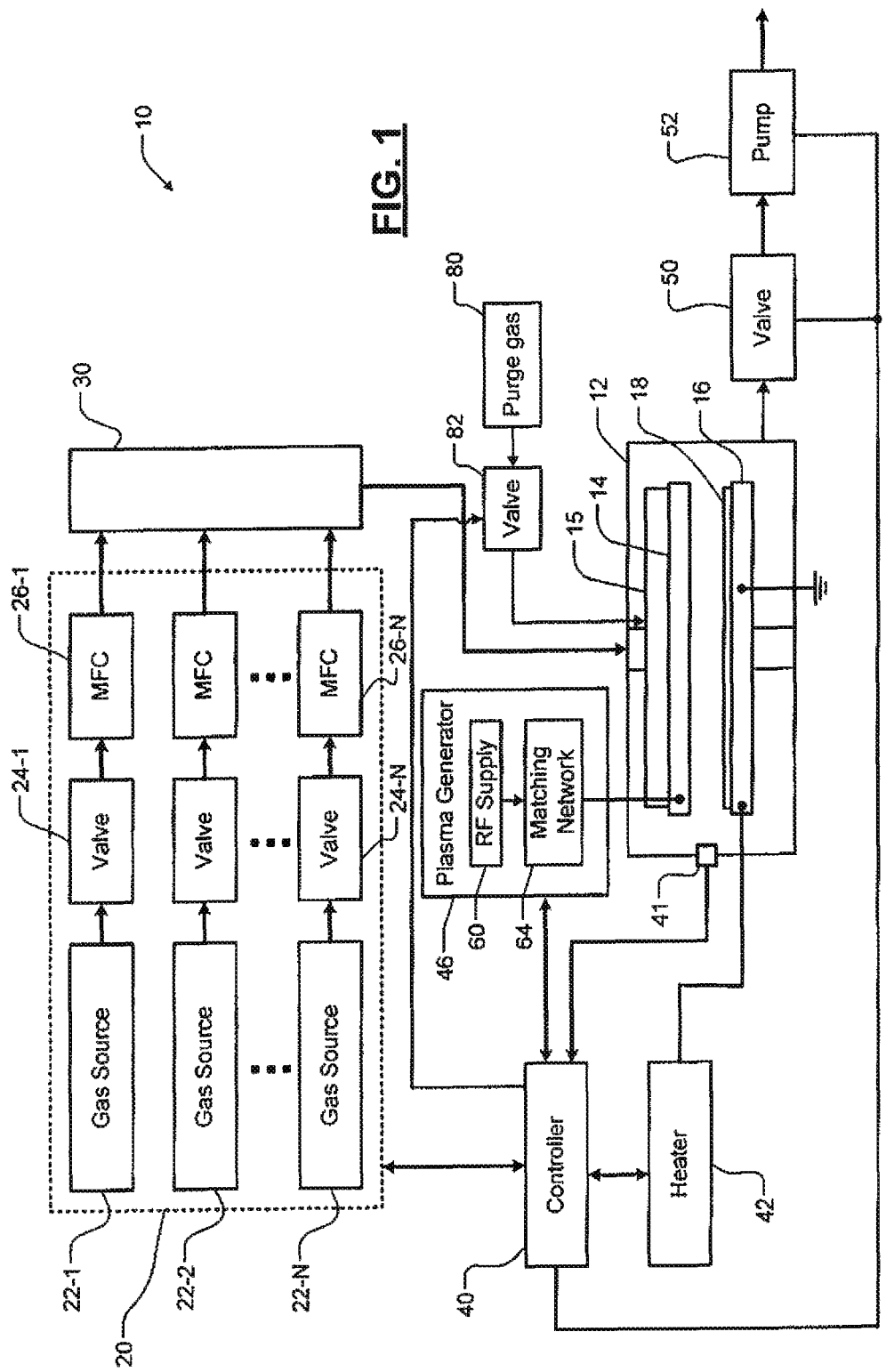
FIG. 1 is a functional block diagram of an example of a substrate processing system with an edge tuning system to reduce parasitic plasma according to the present disclosure.

Referring now to FIG. 1, an example of a substrate processing system 10 includes a processing chamber 12 with a reaction volume. Process gases may be supplied to the processing chamber 12 using a showerhead 14. In some examples, the showerhead 14 is a chandelier-type showerhead. An edge tuning system 15 is arranged between an upper surface of the showerhead 14 and a top surface of the processing chamber 12 to reduce parasitic plasma as will be described below. As will be described further below, the edge tuning system 15 includes a collar arranged around the stem portion and a parasitic plasma reducing element arranged between the collar and an upper surface of the showerhead.

A substrate 18 such as a semiconductor wafer may be arranged on a substrate support 16 during processing. The substrate support 16 may include a pedestal, an electrostatic chuck, a mechanical chuck or other type of substrate support.

A gas delivery system 20 may include one or more gas sources 22-1, 22-2, ..., and 22-N (collectively gas sources 22), where N is an integer greater than one. Valves 24-1, 24-2, ..., and 24-N (collectively valves 24), mass flow controllers 26-1, 26-2, ..., and 26-N (collectively mass flow controllers 26), or other flow control devices may be used to controllably supply one or more gases to a manifold 30, which supplies a gas mixture to the processing chamber 12.

A controller 40 may be used to monitor process parameters such as temperature, pressure etc. (using one or more sensors 41) and to control process timing. The controller 40 may be used to control process devices such as the gas delivery system 20, a substrate support heater 42, and/or an RF plasma generator 46. The controller 40 may also be used to evacuate the processing chamber 12 using a valve 50 and pump 52.

The RF plasma generator 46 generates the RF plasma in the processing chamber. The RF plasma generator 46 may be an inductive or capacitive-type RF plasma generator. In some examples, the RF plasma generator 46 may include an RF supply 60 and a matching and distribution network 64. While the RF plasma generator 46 is shown connected to the showerhead 14 and the substrate support is grounded or floating, the RF plasma generator 46 can be connected to the substrate support 16 and the showerhead 14 can be grounded or floating. In some examples, purge gas 80 may be selectively supplied to the edge tuning system 15 by a valve 82.

Figure 2:
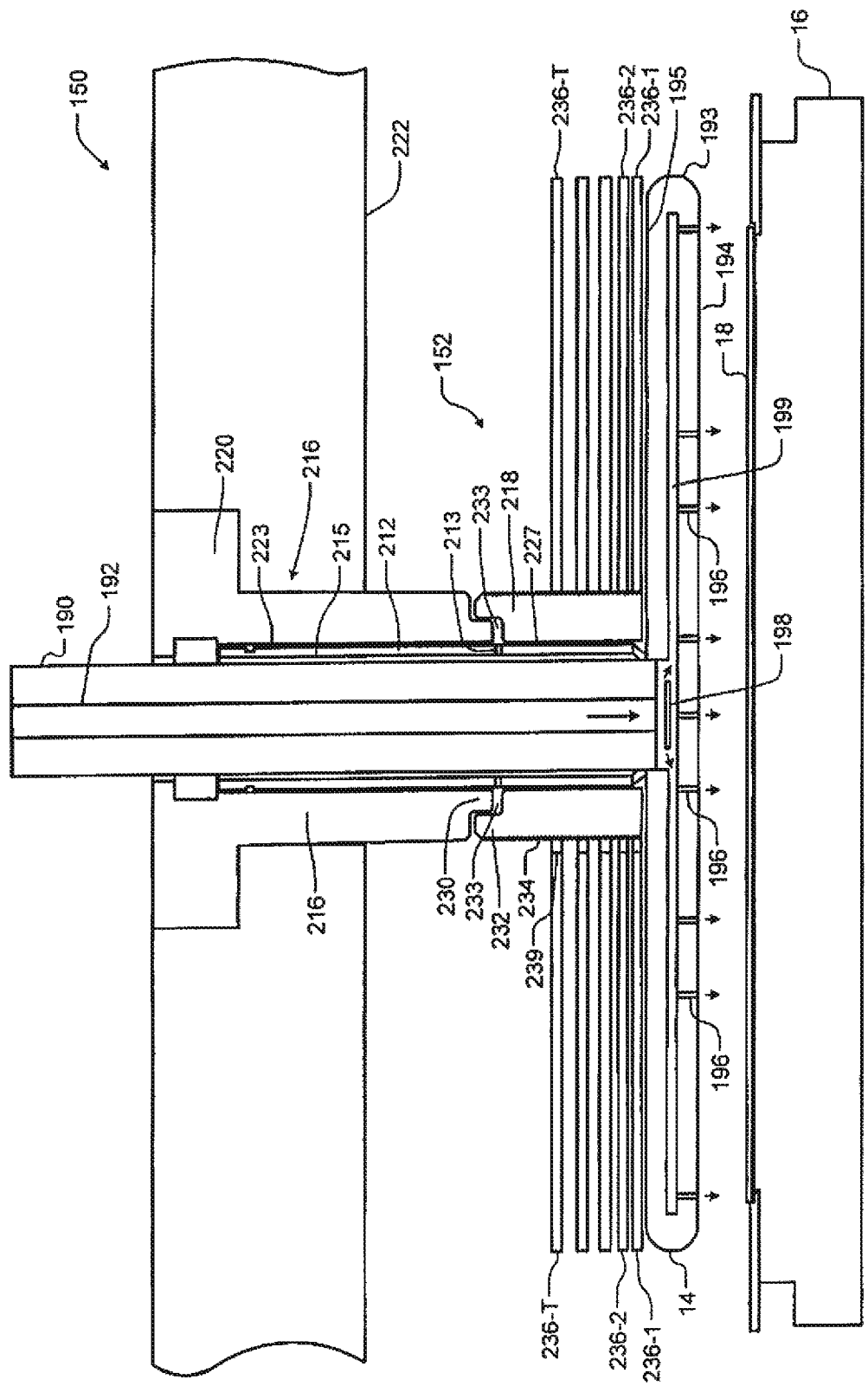
FIG. 2 is a cross-sectional view of an example of a first edge tuning system according to the present disclosure.

Referring now to FIGS. 2-4B, an example of a substrate processing system 150 including a first edge tuning system 152 is shown. In FIGS. 2, 3A and 3B, a showerhead 14 is shown in additional detail and includes a stem portion 190 including a central cavity 192 for receiving the gas mixture from the manifold 30. The showerhead 14 further includes a base portion 193 including a bottom or substrate-facing surface 194 and a top surface 195. The substrate-facing surface 194 includes a plurality of spaced holes 196. Process gas flowing through the cavity 192 of the stem portion 190 may impinge upon a dispersion plate 198 before entering a cavity 199. The process gas exits the cavity 199 through the plurality of holes 196.

The first edge tuning system 152 further includes an inner collar 212 that is arranged around an outer diameter of the stem portion 190. The inner collar 212 includes one or more holes 213 passing therethrough. The stem portion 190 passes through an inner cavity 215 of the inner collar 212. An upper outer collar 216 may have a generally "T"-shaped cross-section and is arranged above a lower outer collar 218. An upper portion 220 of the upper outer collar 216 facilitates mounting to a top surface 222 of the processing chamber. An inner cavity 223 of the upper outer collar 216 receives the inner collar 212 and the stem portion 190 of the showerhead 14. An inner cavity 227 of the lower outer collar 218 also receives the inner collar 212 and the stem portion 190 of the showerhead 14.

In some examples, a lower portion of the upper outer collar 216 may define a first mating surface 230 that is arranged adjacent to a second mating surface 232 defined on an upper portion of the lower outer collar 218. The plurality of holes 213 in the inner collar 212 may be aligned with a gap 233 formed between the first and second mating surfaces 230 and 232. During operation, purge gas may be supplied through the hole 213 and the gap 233. A lower portion of the inner collar 212 may include openings 252 (FIG. 3A) to allow purge gas to flow beneath the collar 212, the lower outer collar 218, and the plates 236.

A radially outer surface of the lower outer collar 218 may include threads 234. The edge tuning system 152 further includes a parasitic plasma reducing element that includes a plurality of plates 236-1, 236-2, ..., and 236-T (collectively plates 236). The plates 236 may include a threaded inner opening 237. The plates 236 may be threaded onto the threads 234 of the lower outer collar 218. The plates 236 may be spaced with uniform or non-uniform spacing. In some examples, the plates 236 are spaced with successively increasing spacing, although other spacing may be used. In other examples, the plates 236 are spaced with successively decreasing spacing, although other spacing may be used. In some examples, the plates 236 include one or more cutouts 239 formed on the threaded inner opening 237. The cutouts 239 allow purge gas to flow between the plates 236.

During operation, process gas or purge gas flows through the stem portion 190 and into the cavity 199. The process gas or purge gas is distributed across the substrate 18 by the plurality of holes 196. Secondary purge gas is supplied between the inner collar 212 and the stem portion 190. The purge gas flows through the holes 213 and into the gap 233. The purge gas also flows through the openings 252 and the cutouts 239 between the plates 236. The edge tuning system 152 helps to reduce parasitic plasma during steps that include the use of plasma.

In some examples, the plates 236 are made of aluminum, although other materials may be used. In some examples, the plates 236 are made of Al7075 aluminum, although other materials may be used. In some examples, the plates 236 have a thickness of 0.070" to 0.110". In some examples, the plates 236 have a thickness of 0.090". In some examples, a top one of the plates 236 has nine of the cutouts 239 (each at 0.125") that are spaced around the inner opening 237 and plates arranged below the top one of the plates have fifteen cutouts 239 (each at 0.125") that are spaced around the inner opening 237, although additional or fewer cutouts may be used. The cutouts 239 may be spaced in a uniform or non-uniform pattern.

In FIGS. 4A and 4B, the inner collar 212 is shown in further detail. The inner collar 212 is generally cylindrical and includes the inner cavity 215 and first and second openings 260 and 261 at opposite ends thereof. An inner surface 264 of the inner collar 212 may include one or more projections 280 that project radially inwardly and may extend the length of the inner collar 212 or part of the length of the inner collar 212. The one or more projections 280 maintain a predetermined spacing between the inner collar 212 and a radially outer surface of the stem portion 190 of the showerhead 14.

The inner collar 212 in FIGS. 4A and 4B includes the holes 213 that extend from the inner surface 264 to an outer surface 282 of the inner collar 212. A notch 290 may be formed in the radially outer surface 282 of the inner collar 212 adjacent to an upper portion of the inner collar 212. The openings 252 may be defined by one or more scalloped or arcuate sections 262. For example, in FIG. 4, there are four scalloped or arcuate sections 262-1, 262-2, 262-3 and 262-4. In some examples, a junction 263 between arcuate sections 262-1 and 262-2 is located lower than other junctions between other ones of the arcuate sections 262. The inner collar 212 may rest on the junction 263.

Referring now to FIG. 5, an example of a substrate processing system 300 including a second edge tuning system 306 is shown. The second edge tuning system 306 includes a collar 308 arranged around the stem portion 190 and a parasitic plasma reducing element that includes a showerhead cover 320 arranged around the base portion 193 of the showerhead 14.

The collar 308 may include an upper "T"-shaped section similar to that shown in FIG. 2 to attach the collar 308 and the showerhead 14 to the upper surface of the processing chamber. The collar 308 includes a central cavity 309 that receives the stem portion 190 of the showerhead 14. The collar 308 further includes a plurality of holes 314 that extend through the collar 308. In some examples, the plurality of holes 314 is arranged perpendicular to the stem portion 190. During operation, purge gas flows through the plurality of holes 314 and below a lower portion of the collar 308 to purge areas between the showerhead cover 320, the showerhead 14 and the upper surface of the processing chamber.

The showerhead cover 320 has a generally "C"-shaped cross-section and includes an upper surface 322, a lower surface 324 and a central opening 326 for receiving the stem portion 190. The central opening 326 may provide additional clearance between the stem portion 190 to allow purge gas flow between the showerhead 14 and the showerhead cover 320. Radial end portions 330 of the showerhead cover 320 extend past a radially outer edge of the base portion 193 of the showerhead 14 and then downwardly. A lower portion 332 of the showerhead cover 320 may extend to the lower surface 194 of the base portion 193 of the showerhead 14 or slightly above or below the lower surface 194 of the base portion 193 of the showerhead 14. One or more spacers 338 may be provided to maintain spacing between the showerhead cover 320 and the showerhead 14. In some examples, the showerhead cover 320 is made of ceramic, although other materials may be used.

In some examples, the showerhead cover 320 has a thickness between ⅜" and 1". In some examples, a radially outer end of the showerhead 14 is spaced 0.120" from an inner surface of the showerhead cover 320. In some examples, the spacer 338 has a thickness of ¼" to ½". In some examples, the spacer 338 has a thickness of ⅜".

Figure 6:
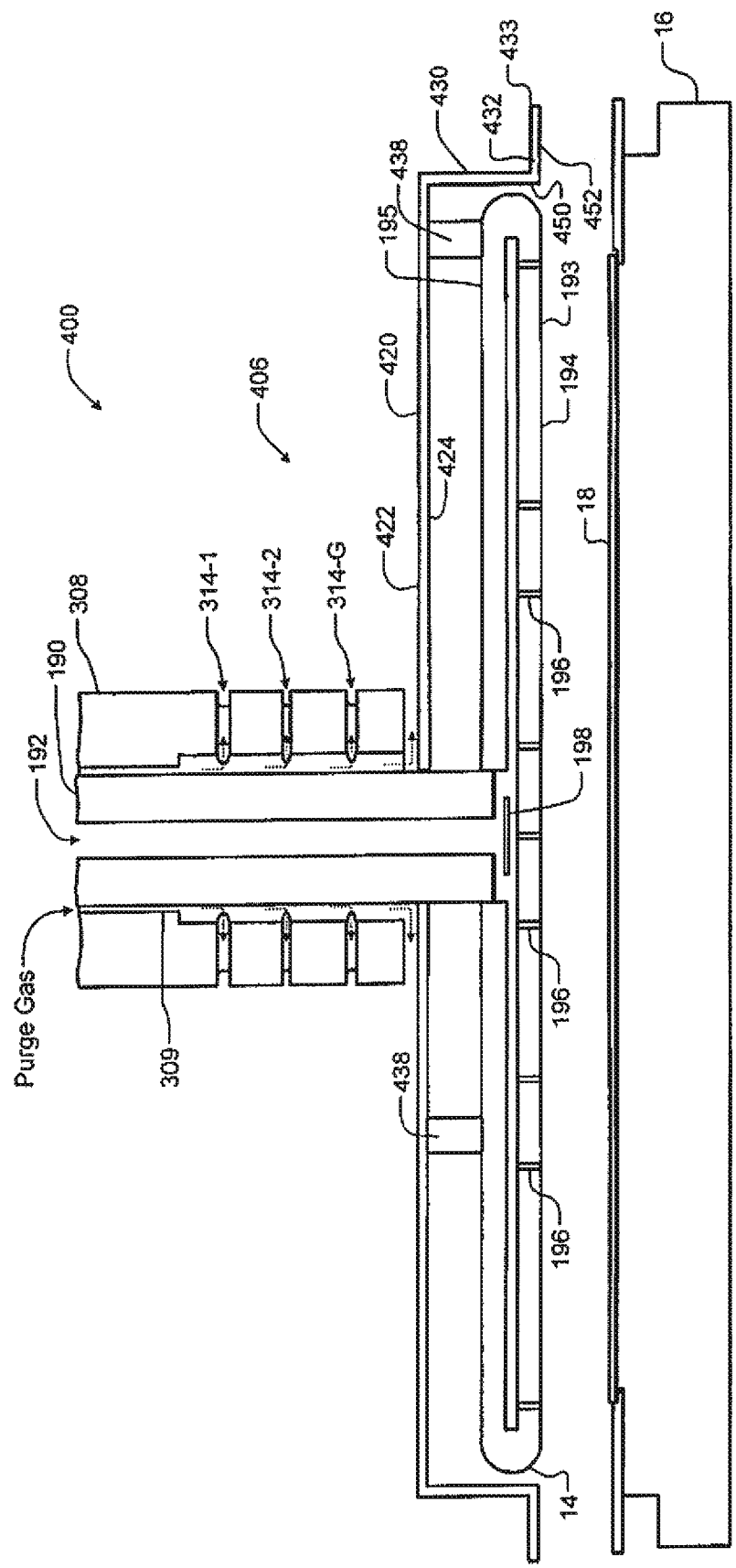
FIG. 6 is a cross-sectional view of an example of a third edge tuning system according to the present disclosure.

Referring now to FIG. 6, an example of a substrate processing system 400 including a third edge tuning system 406 is shown. The third edge tuning system 406 includes the collar 308 described above and a parasitic plasma reducing element that includes a showerhead cover 420. The showerhead cover 420 includes a first portion including a generally "C"-shaped cross-section and includes an upper surface 422, a lower surface 424 and a central opening 426 for receiving the stem portion 190. Radially outer end portions 430 of the showerhead cover 420 extend over a radially outer edge of the base portion 193 of the showerhead 14. A lower portion 432 of the showerhead cover 420 may extend to the lower surface 194 of the base portion 193 of the showerhead 14 or slightly above or below the lower surface 194 of the base portion 193 of the showerhead 14 before extending radially outwardly in a plane generally parallel to the substrate 18 as shown at 433. One or more spacers 438 may be provided to maintain spacing between the showerhead cover 420 and the showerhead 14.

In some examples, the showerhead cover 420 has a thickness between 1/16" and ¼". In some examples, a radially outer end of the showerhead 14 is spaced (e.g. 0.03125") from an inner surface 450 of the showerhead cover 420 and a surface 452 is spaced (e.g. 0.03125") above the bottom surface 194 of the showerhead 14. In some examples, the spacer 438 has a thickness between ¼" and ¾". In some examples, the spacer 438 has a thickness of ½".

Figure 7A:
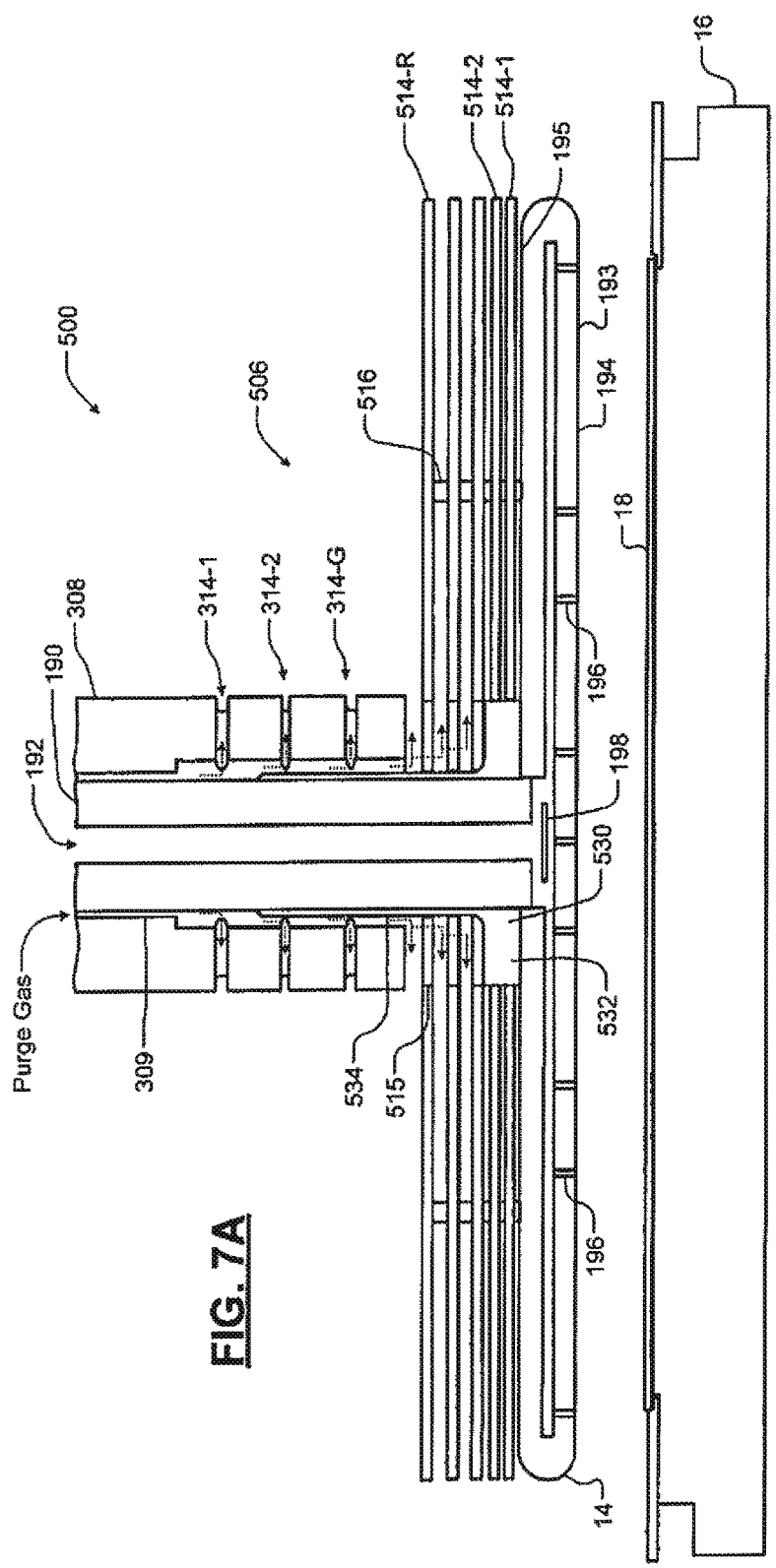
FIGS. 7A and 7B include a cross-sectional view and a top view, respectively, of an example of a fourth edge tuning system according to the present disclosure.
Figure 7B:
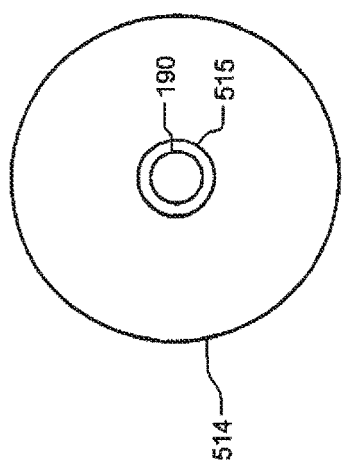

Referring now to FIGS. 7A and 7B, an example of a substrate processing system 500 including a fourth edge tuning system 506 is shown. The fourth edge tuning system 506 includes the collar 308 described above and a parasitic plasma reducing element that includes a plurality of plates 514-1, 514-2, . . . , and 514-R (collectively plates 514). The plates 514 may be spaced apart using spacers 516 or other mechanism.

In some examples, the spacers 516 may be made of ceramic. In some examples, the plates 514 are made of aluminum such as Al7075 aluminum, although other materials may be used. In some examples, the plates 514 have a thickness of 0.070" to 0.110". In some examples, the plates 514 have a thickness of 0.090".

An insert 530 may be arranged between the stem portion 190 of the showerhead 14 and radially inner edges of the plates 514 and the cavity 309 of the collar 308. In some examples, the insert 530 is made of plastic such as polyimide-based plastic (such as Vespel®), although other materials may be used. In some examples, the insert 530 may include an annular body portion 532 and a stem portion 534. The annular body portion 532 extends radially outwardly from a lower portion of the stem portion 534. In FIG. 7B, the plates 514 are shown to include an opening 515 that is larger than the stem portion 190. As a result, purge gas flows between the plates 514.

In some examples, the systems and methods described herein perform secondary purging with a reactant gas instead of non-reactive or inert gases. For example only, molecular oxygen ($O_2$) or nitrous oxide ($N_2O$) may be used for the secondary purging when depositing silicon dioxide ($SiO_2$) or titanium dioxide ($TiO_2$) films. For example only, molecular nitrogen ($N_2$) or ammonia ($NH_3$) may be used for secondary purging when depositing silicon nitride (SiN) films. Additionally while $SiO_2$ and $TiO_2$ are specifically disclosed herein, the present disclosure relates to other ALD oxide or nitride films including silicon (Si), hafnium (Hf), aluminum (Al), titanium (Ti), zirconium (Zr), etc.

In some examples, molecular oxygen or molecular hydrogen are used as a secondary purge gas. The use of reactant gas such as molecular oxygen helps to prevent light-up and/or associated hollow cathode discharge (HCD) signatures that are observed when argon is used. Argon has a lower breakdown voltage than molecular oxygen at typical process pressures. When a reactant gas such as molecular oxygen is used instead of argon, thickness variations on the front side edge profile are also eliminated (particularly at a notch).

Figure 8:
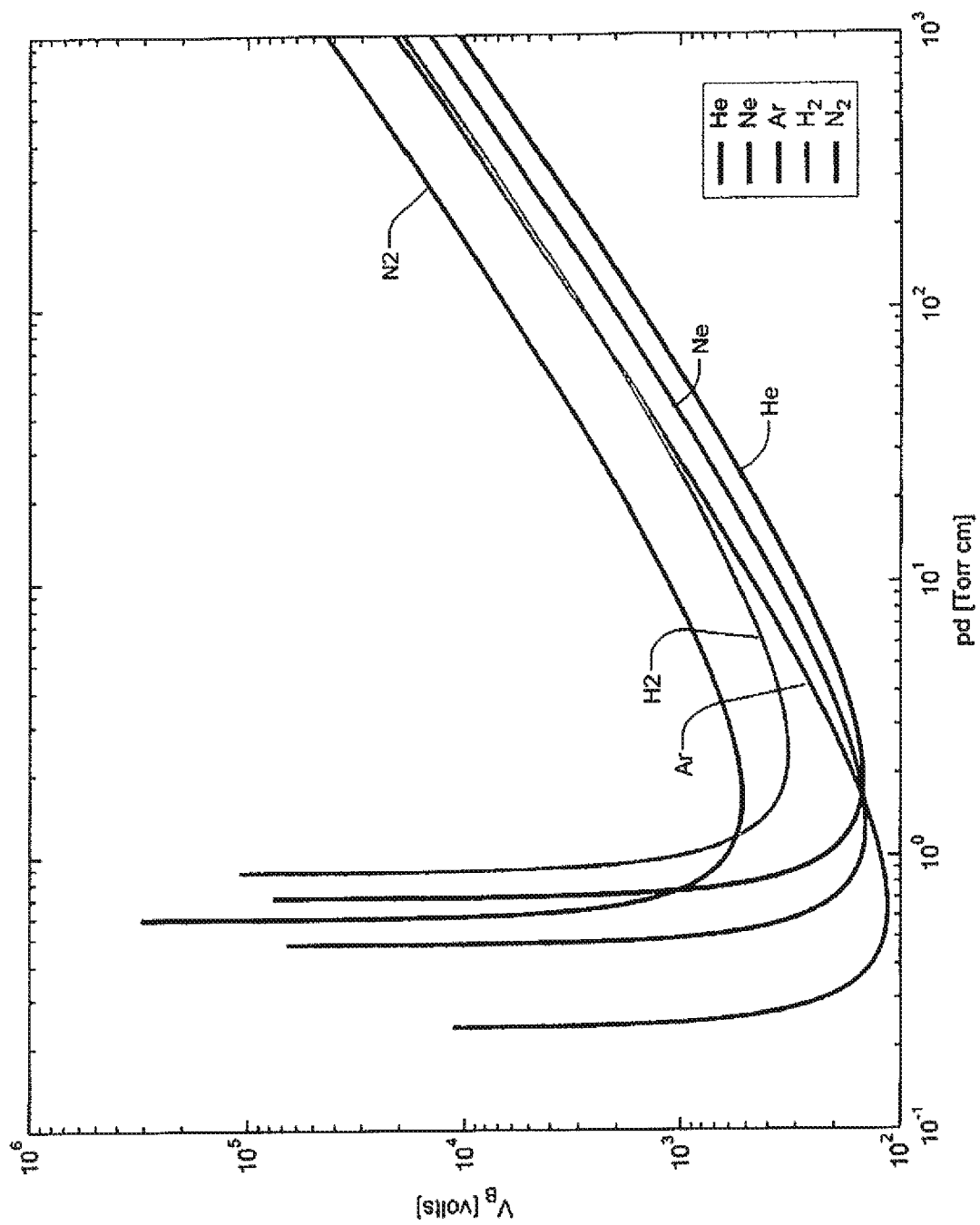
FIG. 8 is a graph illustrating breakdown voltage as a function of pressure for various gases.

Referring now to FIG. 8, a Paschen curve is shown. The breakdown voltage of inert gases such as Argon is relatively low at typical process pressures such as 2-10 Torr. As can be seen, the breakdown voltage of molecular hydrogen and molecular nitrogen are higher for some process pressures. In some examples, the secondary purge gas is selected to have a higher breakdown voltage than argon at the selected process pressure. For example only, molecular hydrogen may be used when the processing chamber operates at process pressures from 2-3 Torr but may not be used at higher process pressures where argon has a higher breakdown voltage.

In other features, the film is deposited using atomic layer deposition. The method further includes maintaining the processing chamber at a vacuum pressure of 2 to 3 Torr.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer substrate support, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system for depositing film on a substrate, comprising:
   a processing chamber defining a reaction volume;
   a showerhead including:
      a stem portion having one end connected adjacent to an upper surface of the processing chamber; and
      a base portion connected to an opposite end of the stem portion and extending radially outwardly from the stem portion,
      wherein the showerhead is configured to introduce at least one of process gas and purge gas into the reaction volume;
   a plasma generator configured to selectively generate RF plasma in the reaction volume; and
   an edge tuning system including:
      a collar arranged around the stem portion of the showerhead between the base portion of the showerhead and the upper surface of the processing chamber,
      wherein the collar includes one or more holes for supplying purge gas from an inner cavity of the collar to an area between the base portion of the showerhead and the upper surface of the processing chamber; and a parasitic plasma reducing element including a showerhead cover that is made of a ceramic material and that includes:
 a first portion with a "C"-shaped cross section that covers an upper surface of the showerhead and sides of the showerhead; and
 a second portion that extends radially outwardly from opposite ends of the first portion in a plane that is parallel to the substrate.

2. The substrate processing system of claim 1, wherein the showerhead cover has a thickness between ⅜" and 1".

3. The substrate processing system of claim 2, further comprising a spacer arranged between the showerhead cover and the upper surface of the showerhead.

4. The substrate processing system of claim 3, wherein the spacer has a thickness between ¼" and ½".

5. The substrate processing system of claim 1, wherein the showerhead cover has a thickness between 1/16" and ¼".

6. The substrate processing system of claim 5, further comprising a spacer arranged between the showerhead cover and the upper surface of the showerhead.

7. The substrate processing system of claim 6, wherein the spacer has a thickness between ¼" and ¾".

8. The substrate processing system of claim 1, wherein the one or more holes of the collar are configured to supply purge gas from the inner cavity of the collar to an area between the upper surface of the processing chamber and an upper surface of the parasitic plasma reducing element.

9. The substrate processing system of claim 1, wherein a radially outer end of the base portion of the showerhead is spaced 0.120" radially inwardly from an inner surface of the second portion of the parasitic plasma reducing element.

10. The substrate processing system of claim 1, wherein the first portion of the parasitic plasma reducing element includes:
 a third portion that extends radially outwardly from the stem portion of the showerhead in a direction that is perpendicular to the stem portion of the showerhead; and
 a fourth portion that extends perpendicularly to the third portion away from the upper surface of the processing chamber,
 wherein the fourth portion is radially outward from a radially outer edge of the base portion of the showerhead.

11. The substrate processing system of claim 10, wherein the second portion extends radially outwardly from the fourth portion in a plane that is parallel to the substrate.

12. The substrate processing system of claim 10, wherein the extension of the fourth portion away from the upper surface of the processing chamber terminates at a point on a plane that is between an upper surface and a lower surface of the base portion of the showerhead.

13. The substrate processing system of claim 10, wherein the extension of the fourth portion away from the upper surface of the processing chamber terminates at a point on a plane that is between a lower surface of the base portion of the showerhead and the substrate.

14. The substrate processing system of claim 10, wherein the extension of the fourth portion away from the upper surface of the processing chamber terminates at a point on a plane of a lower surface of the base portion of the showerhead.

15. The substrate processing system of claim 1, wherein the collar does not include any holes that are configured to supply purge gas from the inner cavity of the collar to an area between a lower surface of the showerhead cover and an upper surface of the base portion of the showerhead.

16. The substrate processing system of claim 1, wherein the base portion of the showerhead includes a plurality of holes configured to introduce the at least one process gas and purge gas into the reaction volume.

17. The substrate processing system of claim 16 wherein the stem portion of the showerhead includes a central cavity through which the at least one process gas and purge gas flow to the plurality of holes of the base portion.

18. The substrate processing system of claim 17, wherein the showerhead further includes a distribution plate configured to distribute the at least one process gas and purge gas from the central cavity to the plurality of holes of the base portion.

19. The substrate processing system of claim 17, wherein the inner cavity of the collar is located radially outwardly from the central cavity of the stem portion.

20. The substrate processing system of claim 1, wherein the collar includes at least three holes for supplying purge gas from the inner cavity of the collar to the area between the base portion of the showerhead and the upper surface of the processing chamber.

* * * * *